US008673769B2

(12) United States Patent
Boyd et al.

(10) Patent No.: US 8,673,769 B2
(45) Date of Patent: Mar. 18, 2014

(54) METHODS AND APPARATUSES FOR THREE DIMENSIONAL INTEGRATED CIRCUITS

(75) Inventors: John Boyd, Woodlawn (CA); Fritz Redeker, Fremont, CA (US); Yezdi Dordi, Palo Alto, CA (US); Hyungsuk Alexander Yoon, San Jose, CA (US); Shijian Li, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 912 days.

(21) Appl. No.: 11/821,051

(22) Filed: Jun. 20, 2007

(65) Prior Publication Data
US 2008/0315422 A1    Dec. 25, 2008

(51) Int. Cl.
*H01L 21/4763*    (2006.01)
(52) U.S. Cl.
USPC ........... 438/637; 438/672; 438/685; 257/761; 257/672; 257/774; 257/E23.011; 257/E21.479
(58) Field of Classification Search
None
See application file for complete search history.

(56) References Cited

U.S. PATENT DOCUMENTS

| | | | |
|---|---|---|---|
| 6,458,697 B2 * | 10/2002 | Hayashi | 438/672 |
| 6,770,535 B2 * | 8/2004 | Yamada et al. | 438/270 |
| 6,954,993 B1 | 10/2005 | Smith et al. | |
| 6,988,326 B2 | 1/2006 | O'Donnell et al. | |
| 6,988,327 B2 | 1/2006 | Garcia et al. | |
| 7,153,400 B2 | 12/2006 | Ravkin et al. | |
| 7,191,787 B1 | 3/2007 | Redeker et al. | |
| 7,198,055 B2 | 4/2007 | Woods et al. | |
| 7,234,477 B2 | 6/2007 | de Larios et al. | |
| 7,297,190 B1 | 11/2007 | Dordi et al. | |
| 7,306,662 B2 | 12/2007 | Vaskelis et al. | |
| 2002/0064952 A1 * | 5/2002 | Yu et al. | 438/688 |
| 2005/0284767 A1 | 12/2005 | Dordi et al. | |
| 2006/0252252 A1 * | 11/2006 | Zhu et al. | 438/618 |
| 2007/0048447 A1 | 3/2007 | Lee et al. | |
| 2007/0292603 A1 | 12/2007 | Dordi et al. | |

OTHER PUBLICATIONS

Copper Electroplating to Fill Blind Vias for Three-Dimensional Integration, S. Spiesshoefer, et al., *Journal of Vacuum Science Technology*, A 24(4) (2006).
U.S. Appl. No. 11/641,364, filed Dec. 18, 2006, Inventors: Yezdi Dordi, et al.

\* cited by examiner

*Primary Examiner* — Yasser A Abdelaziez
(74) *Attorney, Agent, or Firm* — Beyer Law Group LLP (57) ABSTRACT

Methods and apparatuses for fabricating three-dimensional integrated circuits having through hole vias are provided. One aspect of the present invention is a method of gapfill for through hole vias for three-dimensional integrated circuits. The method comprises providing a semiconductor wafer having a plurality of holes for through hole vias and depositing a conformal metal layer to partially fill the holes to leave open voids. The method also includes purging the voids and cleaning the surface of the voids and using a dry deposition process to fill or close the voids. Another aspect of the present invention is an electronic device structure for a three-dimensional integrated circuit.

34 Claims, 7 Drawing Sheets

METHODS AND APPARATUSES FOR THREE DIMENSIONAL INTEGRATED CIRCUITS

CROSS REFERENCE

This application is related to U.S. patent application Ser. No. 11/641,364, filed Dec. 18, 2006; U.S. patent application Ser. No. 11/382,906, filed May 25, 2006; U.S. patent application Ser. No. 11/427,266, filed Jun. 28, 2006; U.S. patent application Ser. No. 11/461,415, filed Jul. 27, 2006; U.S. patent application Ser. No. 11/514,038, filed Aug. 30, 2006; U.S. patent application Ser. No. 10/357,664, filed Feb. 3, 2003; U.S. patent application Ser. No. 10/879,263, filed Jun. 28, 2004; U.S. patent application Ser. No. 10/607,611, filed Jun. 27, 2003; U.S. Pat. No. 7,198,055; and U.S. patent application Ser. No. 10/261,839, filed Sep. 30, 2002. All of these patents and/or applications are incorporated herein, in their entirety, by this reference.

BACKGROUND

This invention pertains to three dimensional integrated circuits, apparatuses, and methods for fabricating three-dimensional integrated circuits; more specifically this invention relates to three-dimensional integrated circuits and methods of interconnect metallization for three-dimensional integrated circuits.

A three-dimensional integrated circuit includes two or more semiconductor chips with integrated circuits or includes two or more semiconductor wafers with integrated circuits. The semiconductor chips or semiconductor wafers are stacked together, bonded, and electrically interconnected in three dimensions, i.e., integrated within the semiconductor chips or semiconductor wafers and integrated between the semiconductor chips or semiconductor wafers. The interconnections between the chips or between the wafers are accomplished by way of through holes from the back side to the front side of one or more of the chips or one or more of the semiconductor wafers. In other words, the electrical connections between the stack of chips or stack of wafers are made by way of the through holes. Three-dimensional integrated circuits have at least one and may have a large number of through holes for interconnect metallization between the semiconductor chips or between the semiconductor wafers.

Three-dimensional integrated circuits, according to some designs, will use through-hole vias that are large, high aspect ratio features with dimensions an order of magnitude or more larger than the minimum geometry features for standard technology dual damascene metallization interconnects. Standard technology electroplating chemistry for metallization of semiconductor devices is designed for bottom-up void free fill. The standard technology electrochemical bottom-up void free fill may not be suitable for bottom-up filling of large, high aspect ratio features required for some through-hole vias.

An alternative to the electrochemical bottom-up void free fill is to use a conformal electrochemical deposition process to fill the through hole vias. Standard technology processes for conformal electrochemical deposition often result in a seam or a closed void which can trap the electrochemical process liquids. Trapped electrochemical process liquids can cause problems such as corrosion of the integrated circuit. Another possible problem of having the process liquids trapped in the integrated circuit is that the liquids may be vaporized during subsequent process steps, especially those at high temperature or low pressure, and result in physical damage to the integrated circuit.

Clearly, all of the requirements for fabricating three-dimensional integrated circuits cannot be met using standard two-dimensional integrated circuit fabrication technology. The practical fabrication of high reliability three-dimensional integrated circuits will require new processes capable of meeting the requirements for metallization of three-dimensional integrated circuits. More specifically, there is a need for new processes capable of meeting the unusual aspect ratio requirements for three-dimensional integrated circuits while allowing deposition of metal layers for high reliability and high-performance devices.

SUMMARY

This invention pertains to methods and apparatuses for fabricating three-dimensional integrated circuits having through hole vias. The present invention seeks to overcome one or more of the deficiencies of the standard technologies for fabricating three-dimensional integrated circuits such as integrated stacks of semiconductor chips or integrated stacks of semiconductor wafers with integrated circuits.

One aspect of the present invention is a method of gapfill for through hole vias for three-dimensional integrated circuits. In one embodiment, the method comprises providing a semiconductor wafer having a plurality of holes for through hole vias and depositing a conformal metal layer to partially fill the holes to leave open voids. The method also includes purging the voids and cleaning the surface of the voids and using a dry deposition process to fill or close the voids.

Another aspect of the present invention is an electronic device structure for a three-dimensional integrated circuit. According to one embodiment, the electronic device structure comprises a substrate having a hole for a through hole metallization interconnect. A conformal metal layer is deposited in the hole by a wet chemical process forming an outer core of material filling the hole. The electronic device structure also has a material deposited by a dry process to form an inner core within the outer core.

It is to be understood that the invention is not limited in its application to the details of construction and to the arrangements of the components set forth in the following description or illustrated in the drawings. The invention is capable of other embodiments and of being practiced and carried out in various ways. In addition, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods, and systems for carrying out aspects of the present invention. It is important, therefore, that the claims be regarded as including such equivalent constructions insofar as they do not depart from the spirit and scope of the present invention.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION

The present invention pertains to interconnect metallization for three-dimensional integrated circuits. More specifically, the present invention pertains to filling holes for through-hole vias for metallization lines running through a semiconductor wafer or other substrate. The metallization is usually used for the upper level semiconductor wafers used in three-dimensional integrated circuits.

The operation of embodiments of the present invention will be discussed below, primarily in the context of processing semiconductor wafers for use in stacked wafer three-dimensional integrated circuits. More specifically, the operation of embodiments of the present invention is discussed below in the context of processing silicon wafers for three-dimensional silicon integrated circuits. However, it is to be understood that embodiments in accordance with the present invention may be used for other semiconductor devices and other semiconductor wafers.

In the following description of the figures, identical reference numerals have been used when designating substantially identical elements or steps that are common to the figures.

Figure 1:
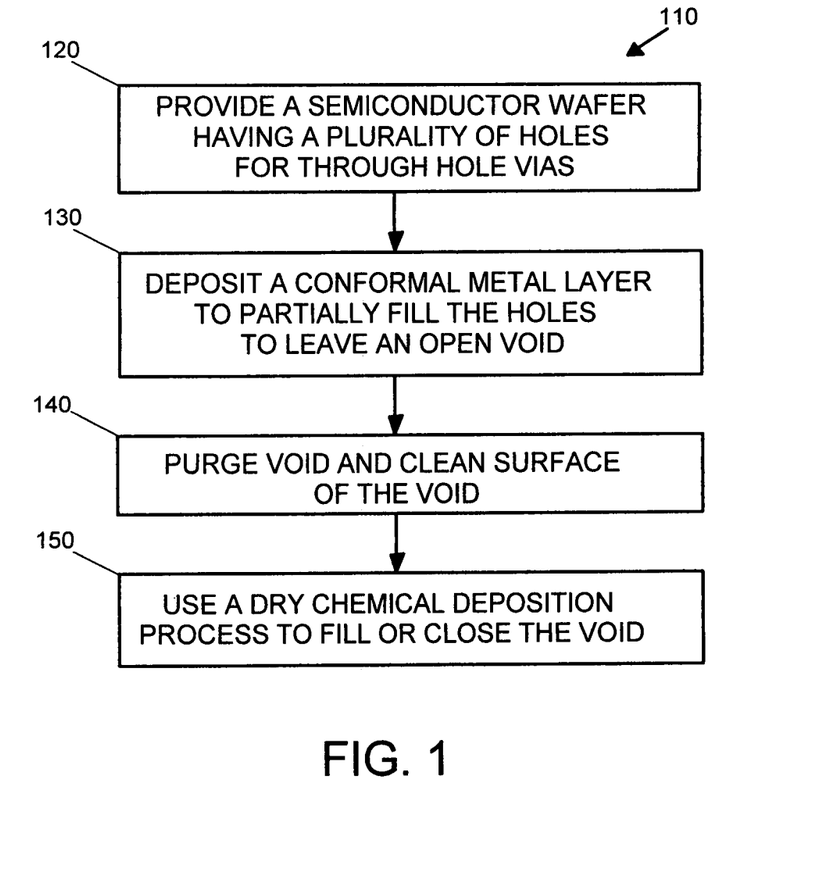
FIG. 1 is a process flow diagram of an embodiment of the present invention.

Reference is now made to FIG. 1 where there is shown a process flow diagram 110 according to one embodiment of the present invention. Process flow diagram 110 shows a method of filling holes to form through-hole vias for three-dimensional integrated circuits. Process flow diagram 110 includes step 120, step 130, step 140, and step 150. Process flow 110 is carried out so that there is substantially no liquid trapped in the hole after completion of the process flow.

Step 120 includes providing a semiconductor wafer or other substrate for fabricating semiconductor devices having a plurality of holes for through hole vias. The semiconductor wafer or other substrate provided in step 120 is selected to be included as part of a stack for three-dimensional integrated circuits. The semiconductor wafer may be any type of semiconductor wafer used for integrated circuits. In a preferred embodiment, the semiconductor wafer is a silicon wafer. As an alternative to using a semiconductor wafer, step 120 may include providing a substrate other than a semiconductor wafer. Suitable substrates include commonly known substrates that are used for fabrication of integrated circuits. As an option, the substrate may be an electrical insulator such as glass or sapphire configured so as to support semiconductor devices.

The semiconductor wafer or other substrate will be interconnected in the three-dimensional integrated circuit, which requires electrical connections between one or more of the semiconductor wafers or other substrates. The plurality of holes described in step 120 are blind holes fabricated so that they have a width necessary for a through hole via and a depth sufficient to allow the blind holes to be opened to form a through hole via. For many applications, the size of the holes for through hole vias is much greater than holes used for vias in two-dimensional integrated circuits.

Step 130 includes wet chemical deposition of a conformal metal layer so as to only partially fill the holes. In other words, step 130 is performed so as to intentionally leave open voids formed by the conformal metal layer. The open voids referred to here are defined as voids that are not closed off to the surroundings of the semiconductor wafer or other substrate. The open voids are in fluid communication with the surroundings of the semiconductor wafer, preferably by way of apertures formed by the conformal metal layer deposited in the holes. The apertures are smaller in diameter than the holes. According to a preferred embodiment of the present invention, a conformal metal layer is deposited to a thickness to minimize the size of the apertures while still allowing liquids to be added to and removed from the open void.

As an option for some embodiments of the present invention, the conformal metal layer of step 130 is deposited by chemical vapor deposition. In other words, a dry deposition process can be used to form the conformal metal layer. The chemical vapor deposition process may be an atmospheric pressure process or other chemical vapor deposition process configured to meet the requirements for the conformal metal layer.

Step 140 includes purging the open voids and cleaning the surface of the voids. The preferred techniques for wet chemical deposition of the conformal metal layer use liquids or liquid solutions. As liquids or liquid solutions, they can remain on the surface of the open voids or they can be trapped in the open voids. Step 140 is performed so as to remove the liquids or the liquid solutions used for the conformal metal deposition. The open voids formed in step 130 facilitate the removal of the liquids or the liquid solutions because they maintain fluid communication with the surroundings of the semiconductor wafer or other substrate. More specifically, step 140 uses one or more processes to rinse the semiconductor wafer or other substrate and one or more processes to dry the semiconductor wafer or other substrate so that the open voids are substantially free of the liquids or the liquid solutions. A variety of processes can be used to rinse and dry the semiconductor wafer or other substrate. For some applications, a preferred embodiment of the present invention uses a rinse and dry process described in commonly owned U.S. Pat. Nos. 7,198,055, 6,988,327, 6,954,993, 6,988,326; and U.S. patent application Ser. No. 10/261,839, filed Sep. 30, 2002; all of these patents and/or applications are incorporated herein, in their entirety, by this reference.

An optional step (not shown in FIG. 1) for some embodiments of the present invention includes treating the surface of the conformal metal layer after the open void has been purged and cleaned. Treating the surface of the conformal metal layer may be performed in a variety of ways. The step is performed so as to prepare the surface of the conformal metal layer for follow-on processing steps. Treating the surface of the barrier layer, as an option, may be done to improve the surface adhesion, to minimize an interface boundary, to remove surface contaminants such as surface oxide and such as carbon compounds, or to improve the contact resistance for layers deposited on the conformal metal layer. According to one embodiment of the present invention, treating the surface of the conformal metal layer is accomplished by subjecting the surface of the barrier layer to a hydrogen containing plasma. The hydrogen containing plasma may be configured to remove contaminants on the surface of the conformal metal layer such as to decompose metal oxides formed on the surface of the conformal metal layer so as to produce a metal rich surface at the surface of the conformal metal layer. An example of a suitable hydrogen containing plasma for treating the surface of the conformal metal layer is described in commonly owned U.S. patent application Ser. No. 11/514,038, filed on Aug. 30, 2006 and is incorporated herein, in its entirety, by this reference.

Step 150 includes using a dry deposition process to fill or close the open voids. The dry deposition process is performed after the open voids have been purged and cleaned. Preferably, the dry deposition process is a vacuum deposition process or other low-pressure deposition process. The dry deposition process may be performed in such a way so as to further fill the open voids, possibly to the point of completely filling the open voids. Alternatively, the dry deposition process may be performed in such a way so as to further fill the open voids and to close off the apertures to the open voids so that the open voids are formed into closed voids disposed so that they are not detrimental during further processing of the integrated circuits and during use of the integrated circuits.

The dry deposition process is used so as to avoid having liquid trapped in the closed voids. The use of vacuum deposition or other low-pressure deposition processes are preferred so as to minimize the amount of gas that might be trapped in the closed voids. Furthermore, the use of low-pressure deposition processes can improve the possibility of further filling and, possibly completely filling the open voids.

Figure 1A:
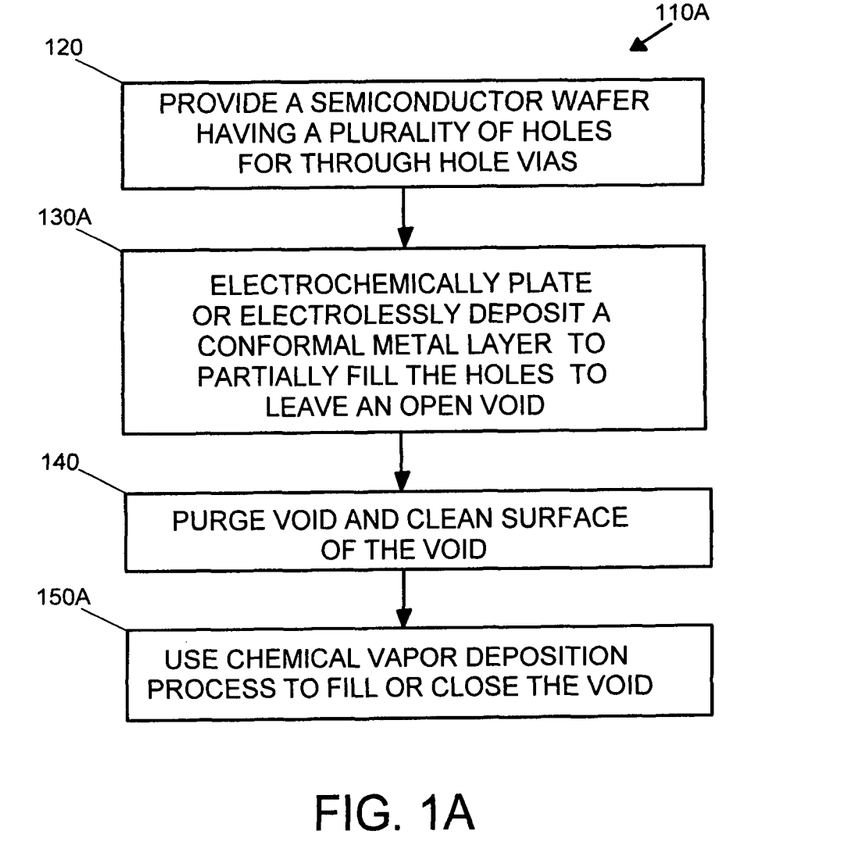
FIG. 1A is a process flow diagram of an embodiment of the present invention.

Reference is now made to FIG. 1A where there is shown a process flow diagram 110A according to one embodiment of the present invention. Process flow diagram 110A shows a method of filling holes to form through-hole vias for three-dimensional integrated circuits. Process flow diagram 110A includes step 120, step 130A, step 140, and step 150A. Step 120 and step 140 shown in FIG. 1A are essentially the same as step 120 and step 140 described for FIG. 1. Process flow 110A is carried out so that there is substantially no liquid trapped in the holes after completion of the process flow.

Step 120 includes providing a semiconductor wafer or other substrate for fabricating semiconductor devices having a plurality of holes for through hole vias. The semiconductor wafer or other substrate provided in step 120 is selected to be included as part of a stack for three-dimensional integrated circuits. The semiconductor wafer may be any type of semiconductor wafer used for integrated circuits. In a preferred embodiment, the semiconductor wafer is a silicon wafer. As an alternative to using a semiconductor wafer, step 120 may include providing a substrate other than a semiconductor wafer.

The semiconductor wafer or other substrate will be interconnected in the three-dimensional integrated circuit, which requires electrical connections between one or more of the semiconductor wafers or other substrates. The plurality of holes described in step 120 are blind holes fabricated so that they have a width necessary for a through hole via and a depth sufficient to allow the blind holes to be opened to form a through hole via.

Step 130A includes electrochemically plating or electrolessly depositing a conformal metal layer so as to only partially fill the holes. In other words, step 130A is performed so as to intentionally leave open voids formed by the conformal metal layer. The open voids referred to here are defined as voids that are not closed off to the surroundings of the semiconductor wafer or other substrate. The open voids are in fluid communication with the surroundings of the semiconductor wafer, preferably by way of apertures formed by the conformal metal layer deposited in the holes. The apertures are smaller in diameter than the holes. According to a preferred embodiment of the present invention, a conformal metal layer is deposited to a thickness to minimize the size of the apertures while still allowing liquids to be added to and removed from the open void.

For a preferred embodiment of the present invention, the conformal metal layer comprises copper. More specifically, a conformal layer of copper is deposited using a process such as electrochemical plating or electroless deposition. Electrochemical plating and electroless deposition are well-known wet processes for depositing metal layers such as copper.

Step 140 includes purging the open voids and cleaning the surface of the voids. The preferred techniques for wet chemical deposition of the conformal metal layer use liquids or liquid solutions. As liquids or liquid solutions, they can remain on the surface of the open voids or they can be trapped in the open voids. Step 140 is performed so as to remove the liquids or the liquid solutions used for the conformal metal deposition. The open voids formed in step 130 facilitate the removal of the liquids or the liquid solutions because they maintain fluid communication with the surroundings of the semiconductor wafer or other substrate. More specifically, step 140 uses one or more processes to rinse the semiconductor wafer or other substrate and one or more processes to dry the semiconductor wafer or other substrate so that the open voids are substantially free of the liquids or the liquid solutions.

Step 150A includes using chemical vapor deposition to fill or close the open voids. The chemical vapor deposition is performed after the open voids have been purged and cleaned. Preferably, the chemical vapor deposition is a vacuum deposition process or other low-pressure deposition process. The chemical vapor deposition process may be performed in such a way so as to further fill the open voids, possibly to the point of completely filling the open voids. Alternatively, the dry deposition process may be performed in such a way so as to further fill the open voids and to close off the apertures to the open voids so that the open voids are formed into closed voids disposed so that they are not detrimental during further processing of the integrated circuits and during use of the integrated circuits.

The chemical vapor deposition is used so as to avoid having liquid trapped in the closed voids. The use of vacuum deposition or other low-pressure deposition processes are preferred so as to minimize the amount of gas that might be trapped in the closed voids. Furthermore, the use of chemical vapor deposition can improve the possibility of further filling and possibly completely filling the open voids.

Embodiments of the present invention may include one or more of a variety of options for the chemical vapor deposition process. For one embodiment of the present invention, the method includes chemical vapor deposition of a metal. Embodiments of the present invention that include having the conformal metal layer comprise copper may preferably include the use of chemical vapor deposition of copper to fill or close the open void. Other embodiments of the present invention include using chemical vapor deposition of a metal such as, but not limited to, tantalum, tantalum nitride, or ruthenium.

According to another embodiment of the present invention, the method includes chemical vapor deposition of an electrical insulator. Other embodiments of the present invention include using chemical vapor deposition of an electrical insulator such as, but not limited to, silicon carbide, silicon nitride, silicon carbon nitride, silicon dioxide, aluminum oxide, or aluminum nitride. Embodiments of the present invention that include having the conformal metal layer comprise copper may preferably include using chemical vapor deposition of silicon nitride, silicon carbide, or silicon carbon nitride to fill or close the open void.

Figure 1B:
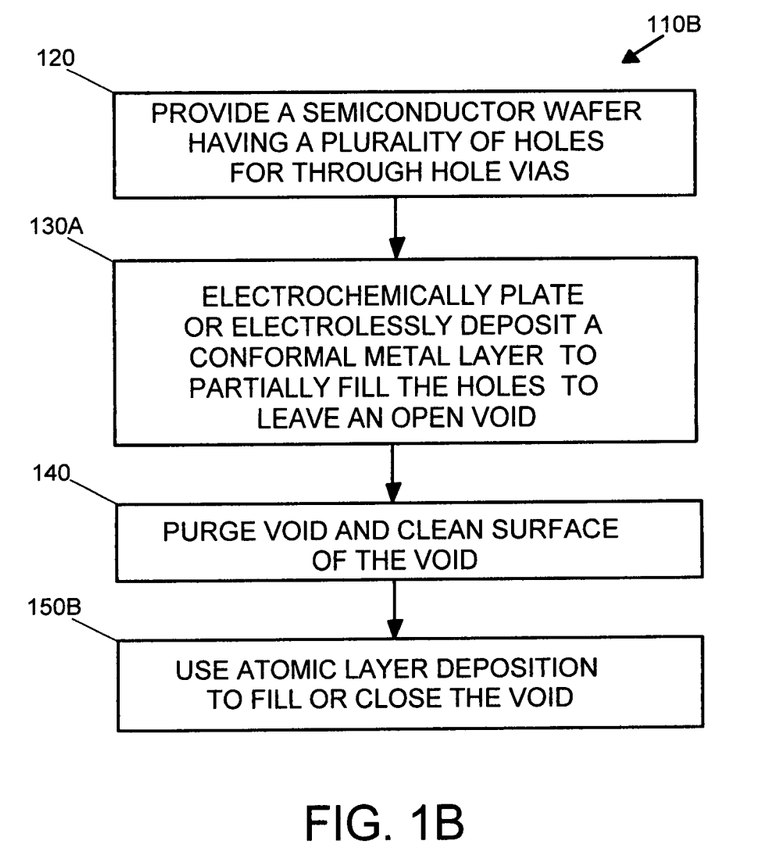
FIG. 1B is a process flow diagram of an embodiment of the present invention.

Reference is now made to FIG. 1B where there is shown a process flow diagram 110B according to one embodiment of the present invention. Process flow diagram 110B shows a method of filling holes to form through-hole vias for three-dimensional integrated circuits. Process flow diagram 110B includes step 120, step 130A, step 140, and step 150B. Step 120, step 130A, and step 140 shown in FIG. 1B are essentially the same as step 120, step 130A, and step 140 described for FIG. 1A. Process flow 110B is carried out so that there is substantially no liquid trapped in the holes after completion of the process flow.

Step 120 includes providing a semiconductor wafer or other substrate for fabricating semiconductor devices having a plurality of holes for through hole vias. The semiconductor wafer or other substrate provided in step 120 is selected to be included as part of a stack for three-dimensional integrated circuits. The semiconductor wafer may be any type of semiconductor wafer used for integrated circuits. In a preferred embodiment, the semiconductor wafer is a silicon wafer. As an alternative to using a semiconductor wafer, step 120 may include providing a substrate other than a semiconductor wafer.

The semiconductor wafer or other substrate will be interconnected in the three-dimensional integrated circuit, which requires electrical connections between one or more of the semiconductor wafers or other substrates. The plurality of holes described in step 120 are blind holes fabricated so that they have a width necessary for a through hole via and a depth sufficient to allow the blind holes to be opened to form a through hole via.

Step 130A includes electrochemically plating or electrolessly depositing a conformal metal layer so as to only partially fill the holes. In other words, step 130A is performed so as to intentionally leave open voids formed by the conformal metal layer. The open voids referred to here are defined as voids that are not closed off to the surroundings of the semiconductor wafer or other substrate. The open voids are in fluid communication with the surroundings of the semiconductor wafer, preferably by way of apertures formed by the conformal metal layer deposited in the holes. The apertures are smaller in diameter than the holes. According to a preferred embodiment of the present invention, a conformal metal layer is deposited to a thickness to minimize the size of the apertures while still allowing liquids to be added to and removed from the open void.

For a preferred embodiment of the present invention, the conformal metal layer comprises copper. More specifically, a conformal layer of copper is deposited using a process such as electrochemical plating or electroless deposition. Electrochemical plating and electroless deposition are both well-known wet processes for depositing metal layers such as copper.

Step 140 includes purging the open voids and cleaning the surface of the voids. The preferred techniques for wet chemical deposition of the conformal metal layer use liquids or liquid solutions. As liquids or liquid solutions, they can remain on the surface of the open voids or they can be trapped in the open voids. Step 140 is performed so as to remove the liquids or the liquid solutions used for the conformal metal deposition. The open voids formed in step 130 facilitate the removal of the liquids or the liquid solutions because they maintain fluid communication with the surroundings of the semiconductor wafer or other substrate. More specifically, step 140 uses one or more processes to rinse the semiconductor wafer or other substrate and one or more processes to dry the semiconductor wafer or other substrate so that the open voids are substantially free of the liquids or the liquid solutions.

Step 150B includes using atomic layer deposition to fill or close the open voids. The atomic layer deposition is performed after the open voids have been purged and cleaned. According to one embodiment of the present invention, the atomic layer deposition is accomplished with a vacuum deposition process or other low-pressure deposition process. According to another embodiment of the present invention, atomic layer deposition is accomplished using a supercritical fluid deposition process. Details of an exemplary reactor for a high-pressure process using supercritical CO2 is described in commonly assigned U.S. patent application Ser. No. 10/357,664, titled "Method and Apparatus for Semiconductor Wafer Cleaning Using High-Frequency Acoustic Energy with Supercritical Fluid," filed on Feb. 3, 2003, which is in incorporated herein by this reference.

The atomic layer deposition process is performed in a way so as to further fill the open voids, possibly to the point of completely filling the open voids. Alternatively, the dry deposition process may be performed in a way so as to further fill the open voids and to close off the apertures to the open voids so that the open voids are formed into closed voids disposed so that they are not detrimental during further processing of the integrated circuits and during use of the integrated circuits.

The atomic layer deposition is used so as to avoid having liquid trapped in the closed voids. The use of vacuum deposition or other low-pressure deposition processes are preferred so as to minimize the amount of gas that might be trapped in the closed voids. Furthermore, the use of the atomic layer deposition can improve the possibility of further filling and possibly of completely filling the open voids.

Embodiments of the present invention may include one or more of a variety of options for the atomic layer deposition process. For one embodiment of the present invention, the method includes atomic layer deposition of a metal. Embodiments of the present invention that include having the conformal metal layer comprising copper may preferably include using atomic layer deposition of copper to fill or close the open void. Other embodiments of the present invention include using atomic layer deposition of a metal such as, but not limited to, tantalum, tantalum nitride, or ruthenium.

According to another embodiment of the present invention, the method includes atomic layer deposition of an electrical insulator. Other embodiments of the present invention include using atomic layer deposition of an electrical insulator such as, but not limited to, silicon carbide, silicon nitride, silicon carbon nitride, silicon dioxide, aluminum oxide, or aluminum nitride. Embodiments of the present invention that include having the conformal metal layer comprise copper may preferably include using atomic layer deposition of silicon nitride, silicon carbide, or silicon carbon nitride to fill or close the open void.

Figure 2:
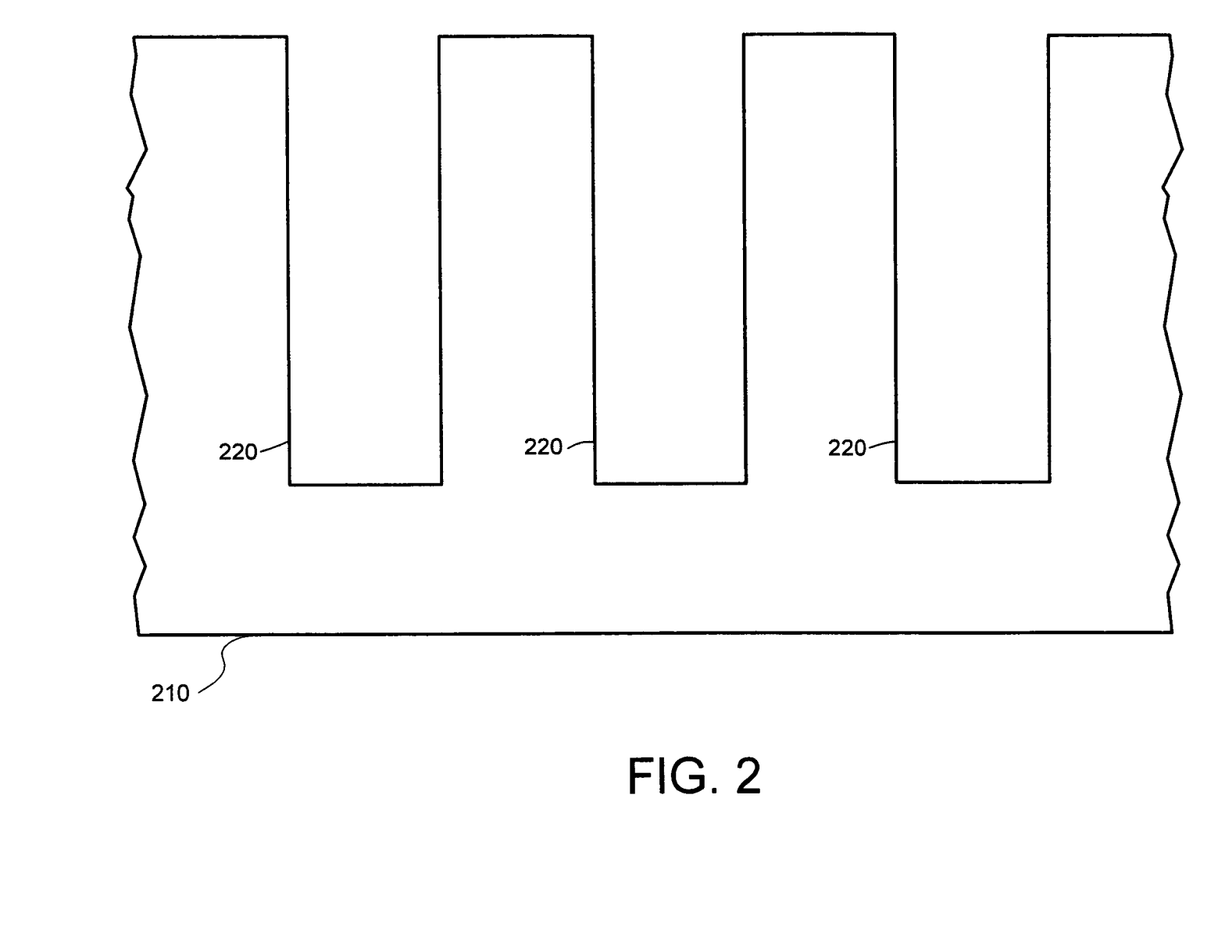
FIG. 2 is a diagram of a substrate to be processed according to an embodiment of the present invention.

To further illustrate the process flows presented in FIGS. 1, 1A, and 1B, reference is now made to FIG. 2, FIG. 3, FIG. 4, and FIG. 5 where there is shown a cross sectional side view of a section of a patterned device wafer processed according to process flow 110, 110A, or 110B. FIG. 2 shows a patterned device wafer 210 to be processed according to process flow 110B in FIG. 1B. Device wafer 210 includes a semiconductor wafer or other substrate for device fabrication and one or more additional layers used to form devices such as integrated circuits. Device wafer 210 has a hole 220 configured so as to be converted into a through hole via for three-dimensional interconnection of integrated circuits. More specifically, hole 220 is initially a blind hole with a diameter and a depth needed for a through hole via interconnection formed by thinning the wafer to make the blind hole a through hole. For some applications of through hole via interconnections, hole 220 may have dimensions of 5-10 µm for the diameter and 25-40 µm for the depth.

Figure 3:
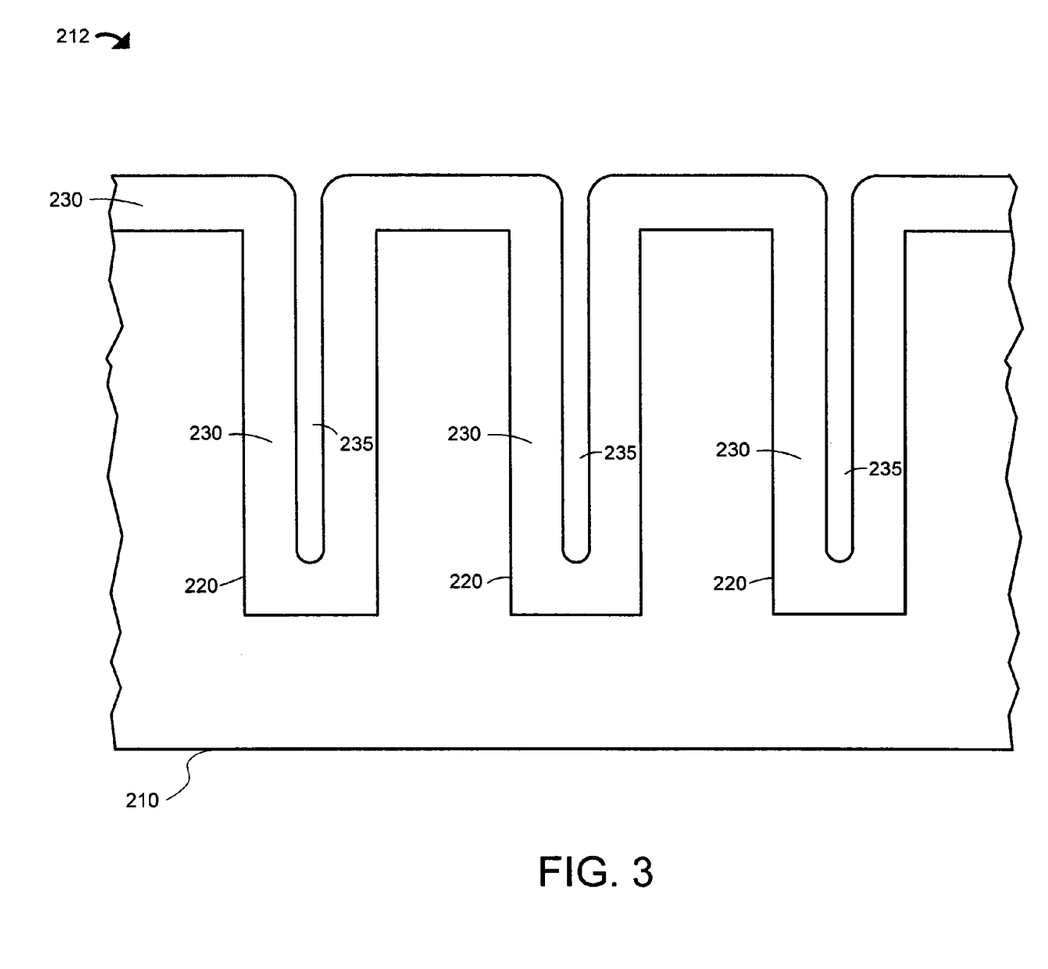
FIG. 3 is a diagram of the substrate from FIG. 2 partially processed according to an embodiment of the present invention.

FIG. 3 shows a patterned device wafer 212 that is essentially the same as the patterned device wafer described in FIG. 2 with the exception that patterned device wafer 212 has been partially processed according to process flow 110B shown in FIG. 1B. More specifically, FIG. 3 shows device wafer 210 having a hole 220 configured so as to be converted into a through hole via for three-dimensional interconnection of integrated circuits. More specifically, hole 220 is initially a blind hole with a diameter and the depth needed for a through hole via interconnection formed by thinning the wafer to make the blind hole a through hole. Device wafer 212 also includes a conformal metal layer 230 electrochemically plated or electrolessly deposited to partially fill hole 220 so as to leave an open void 235.

Preferably, conformal metal layer 230 is deposited to a thickness to make the open void as small as possible without closing off the open void while having the open void dimensions sufficient to allow the open void to be purged and surfaces of the open void cleaned. As an option, a rinse and dry process may be used to purge and clean the open voids. The open voids are purged and cleaned so as to remove liquids or solutions used for the electrochemical plating or the electroless deposition of conformal metal layer 230. Deposition of conformal metal layer 230 is preferably accomplished using electrochemical plating or electroless deposition because those processes can provide high-quality material at acceptable deposition rates for manufacturing integrated circuits.

Furthermore, conformal deposition processes are preferred for embodiments of the present invention so as to provide more control in partially filling hole 220. Unlike some of the standard practices for filling holes with metals, embodiments of the present invention intentionally do not fill the hole completely using a wet chemical process. More specifically, embodiments of the present invention do not try to achieve a super fill of the hole from the bottom up as is usually done for smaller holes than what are needed for through hole vias.

Figure 4:
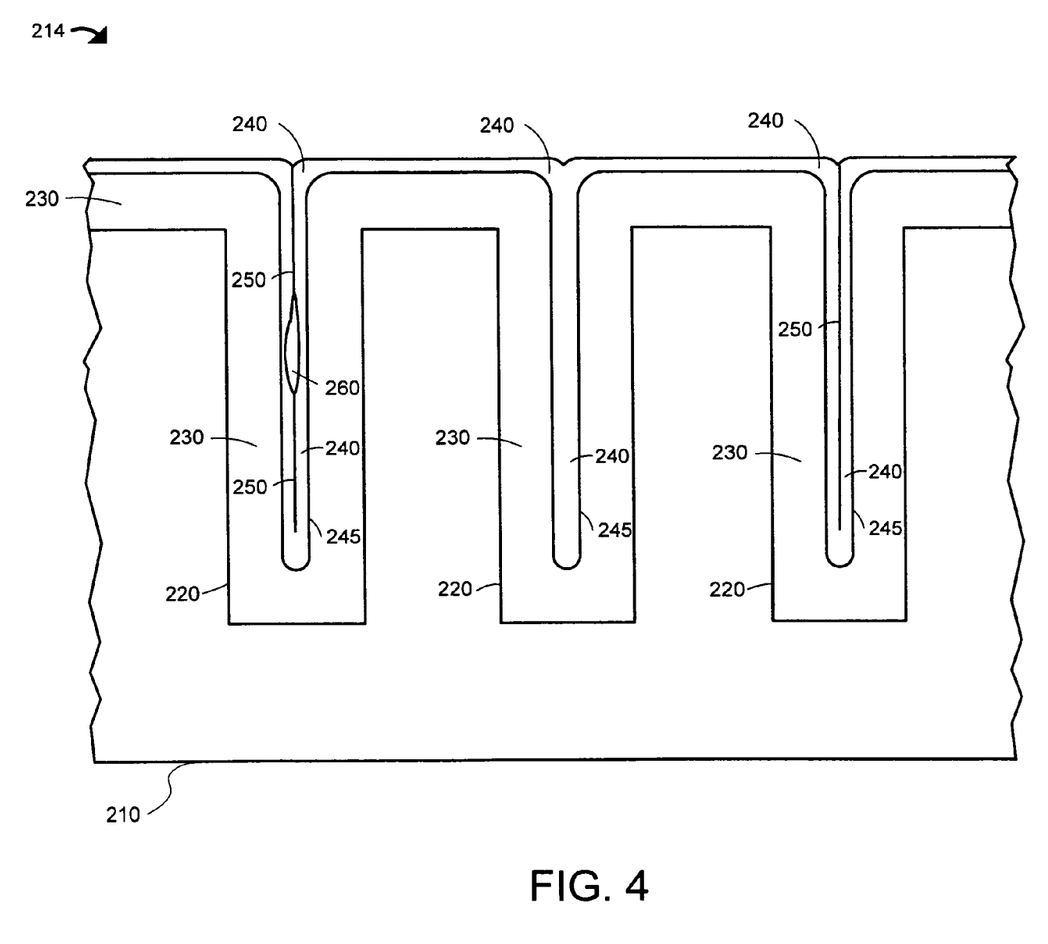
FIG. 4 is a diagram of the substrate from FIG. 2 partially processed according to an embodiment of the present invention.

FIG. 4 shows a patterned device wafer 214 that is essentially the same as the patterned device wafer described in FIG. 2 with the exception that patterned device wafer 214 has been partially processed according to process flow 110B shown in FIG. 1B. More specifically, FIG. 4 shows device wafer 214 having a hole 220 configured so as to be converted into a through hole via for three-dimensional interconnection of integrated circuits. Device wafer 214 also includes a conformal metal layer 230 electrochemically plated or electrolessly deposited to partially fill hole 220 so as to leave an open void 235. FIG. 4 also shows device wafer 214 having a dry deposition layer 240. Dry deposition layer 240 was deposited after the open voids were purged and cleaned so that there is substantially no trapped liquids from previous process steps remaining in the open voids prior to application of dry deposition layer 240.

Preferably, dry deposition layer 240 is accomplished using an atomic layer deposition process. A sufficient amount of dry deposition layer 240 is provided so as to at least partially fill and close off open void 235. More preferably, dry deposition layer 240 is accomplished so as to completely fill open void 235 so as to completely eliminate open void 235. As a result of how dry deposition layer 240 is applied, the filling of open void 235 may result in either a fill with an artifact such as a seam 250, a fill without artifacts, or a fill with a closed void 260. FIG. 4 shows these three possible results for dry deposition layer 240. One of the benefits of using a dry deposition process to form dry deposition layer 240 is that if there is a closed void or a seam formed by dry deposition layer 240, there is no trapped liquid in the closed void or at the seam that can possibly damage the metallization layer during further processing or use of the integrated circuit.

Further processing of patterned device wafer 214 may include well-known process steps that may include removal and planarization of overburden materials, metallization passivation, and further processing to complete the fabrication of electronic devices. To further illustrate some of the further processing, reference is now made to FIG. 5 where there is shown a partially processed semiconductor wafer 216.

Figure 5:
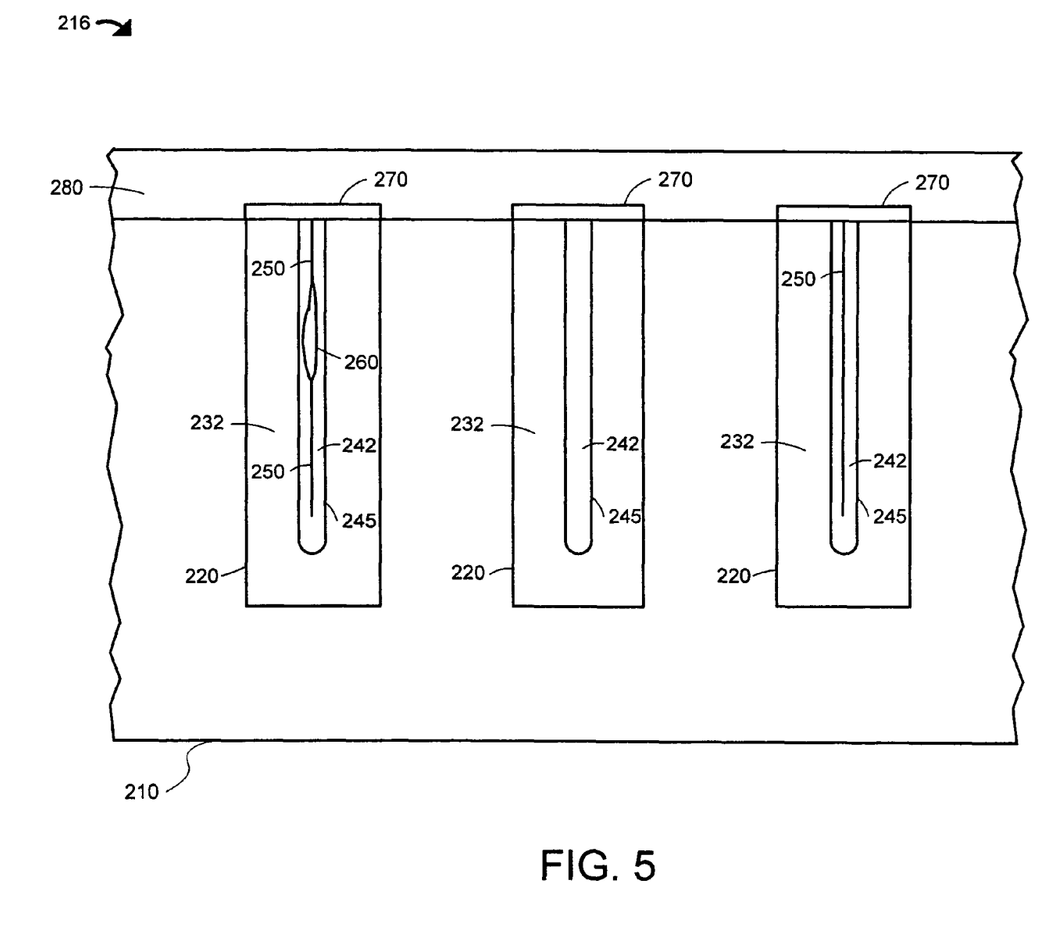
FIG. 5 is a diagram of the substrate from FIG. 2 processed according to an embodiment of the present invention.

FIG. 5 shows processed semiconductor wafer 216 obtained after a partially processed wafer 214, as described in FIG. 4, has been planarized to remove overburden materials, has received a barrier layer 270 or other form of passivation for metal deposited in hole 220, and has received a dielectric layer 280. More specifically, FIG. 5 shows an electronic device structure for a three-dimensional integrated circuit. The electronic device structure includes a substrate 210 having a hole 220 for through hole metallization interconnects. For preferred embodiments of the present invention, hole 220 includes a metallization diffusion barrier, such as a thin layer of tantalum nitride, (metallization diffusion barrier not shown in FIG. 5) lining the walls of hole 220. FIG. 5 also shows a conformal metal layer deposited in hole 220 by a wet chemical process forming an outer core 232 of the material filling hole 220 and a material deposited by a dry chemical process forming an inner core 242 within outer core 232.

Embodiments of the present invention illustrated in FIG. 5 may include one or more of a variety of options for the selection of materials for outer core 232 and inner core 242. For preferred embodiments of the present invention, inner core 242 comprises copper. As an option for some embodiments of the present invention, inner core 242 comprises copper so that hole 220 is substantially filled with copper.

Other embodiments of the present invention include having outer core 232 comprise copper and inner core 242 comprise a semiconductor or insulating material such as, but not limited to, silicon, silicon carbide, silicon carbon nitride, silicon dioxide, silicon nitride, aluminum oxide, and aluminum nitride. Alternatively, embodiments of the present invention may include having outer core 232 comprise copper and inner core 242 comprise an electrically conductive material such as, but not limited to, tantalum, tantalum carbide, tantalum nitride, ruthenium, and cobalt.

The selection of barrier layer 270 and dielectric layer 280 are matters of designer choice based on the type of devices to be fabricated. Optionally, partially processed semiconductor wafer 216 may be further processed to add additional layers of metallization, dielectrics, or to complete additional back-end-of-line processes for forming integrated circuits.

It is to be understood that process artifacts such as interface 245, seam 250, and closed void 260 may be present or they may not be present in devices made according to embodiments of the present invention. The inclusion of these artifacts in the figures is done for illustration purposes so that this disclosure is complete. Furthermore, it should be noted that features that may occur as a result of using embodiments of the present invention may be removed during further processing. More specifically, if interface 245 or seam 250 is formed during processing substrates according to embodiments of the present invention, later performed higher temperature processes such as an anneal may eliminate the interface or seam.

Still further, the occurrence of interface 245 can be further reduced for some applications of the present invention by including a hydrogen plasma treatment of open void 240 prior to the dry deposition process for dry deposition layer 240. In other words, another embodiment of the present invention includes a process such as the processes described for FIG. 1, FIG. 1A, and FIG. 1B that includes a hydrogen plasma treatment of the open void as part of or in addition to purging and cleaning the open voids.

For the specific example of copper metallization, the requirements for three-dimensional integrated circuits may include deposition of a dielectric layer on the sidewalls of the hole, deposition of a barrier layer on the dielectric layer, and a copper fill sufficient to allow electrical interconnection of circuits on different chips or wafers in the stack.

A variety of options exists for the equipment and systems that can be used to carry out embodiments of the present invention. A particularly useful system and equipment configuration for practicing embodiments of the present invention is a controlled environment processing system such as those described in commonly owned U.S. patent application Ser. No. 11/641,364, filed Dec. 18, 2006, titled "METHODS AND SYSTEMS FOR BARRIER LAYER SURFACE PASSIVATION," to Yezdi DORDI, John BOYD, Fritz REDEKER, William THIE, Tiruchirapalli ARUNAGIRI, and Hyungsuk Alexander YOON; U.S. patent application Ser. No. 11/382,906, filed May 25, 2006; U.S. patent application Ser. No. 11/427,266, filed Jun. 28, 2006; U.S. patent application Ser. No. 11/461,415, filed Jul. 27, 2006; U.S. patent application Ser. No. 11/514,038, filed Aug. 30, 2006; U.S. patent application Ser. No. 10/357,664, filed Feb. 3, 2003; U.S. patent application Ser. No. 10/879,263, filed Jun. 28, 2004; and U.S. patent application Ser. No. 10/607,611, filed Jun. 27, 2003; all of these patents and/or applications are incorporated herein, in their entirety, by this reference.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

As used herein, the terms "comprises," "comprising," "includes," "including," "has," "having," "at least one of," or any other variation thereof, are intended to cover a non-exclusive inclusion. For example, a process, method, article, or apparatus that comprises a list of elements is not necessarily limited only to those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Further, unless expressly stated to the contrary, "at least one of" is to be interpreted to mean "one or more." For example, a process, method, article, or apparatus that comprises one or more of a list of elements and if one or more of the elements comprises a sub-list of sub-elements, then the sub-elements are to be considered in the same manner as the elements. For example, at least one of A and B is satisfied by any one of the following: A is true (or present) and B is false (or not present), A is false (or not present) and B is true (or present), and both A and B are true (or present).

What is claimed is:

1. A method comprising:
providing a semiconductor wafer having a plurality of holes, the plurality of holes having dimensions so as to permit using wafer thinning to form the plurality of holes into a plurality of through hole vias;
depositing a conformal metal layer to partially fill the holes to leave open voids;
purging the open voids and cleaning the surface of the open voids; and
using a dry deposition process to fill or close the open voids with silicon.

2. The method of claim 1, wherein depositing a conformal metal layer to partially fill the holes uses a wet chemical process.

3. The method of claim 1, wherein depositing a conformal metal layer to partially fill the holes uses electrochemical plating.

4. The method of claim 1, wherein depositing a conformal metal layer to partially fill the holes uses electroless deposition.

5. The method of claim 1, wherein depositing a conformal metal layer to partially fill the holes uses chemical vapor deposition.

6. The method of claim 1, wherein the conformal metal layer comprises copper.

7. The method of claim 1, wherein purging the open voids and cleaning the surface of the open voids uses a rinse dry process.

8. The method of claim 1, wherein purging the open voids and cleaning the surface of the open voids includes a rinse dry process and oxide removal from the surface of the open voids.

9. The method of claim 1, wherein the dry deposition process comprises chemical vapor deposition.

10. The method of claim 1, wherein the dry deposition process comprises atomic layer deposition.

11. A method comprising:
providing a semiconductor wafer having a plurality of holes, the plurality of holes have dimensions so as to permit using wafer thinning to form the plurality of holes into a plurality of through hole vias;
using a wet chemical process to deposit a conformal copper layer to partially fill the holes to leave open voids;
purging the open voids and cleaning the surface of the open voids; and
using a dry chemical deposition process to deposit silicon carbide to fill or close the open voids.

12. The method of claim 11, wherein the wet chemical process to deposit the conformal copper layer uses electrochemical plating.

13. The method of claim 11, wherein the wet chemical process to deposit the conformal copper layer uses electroless deposition.

14. The method of claim 11, wherein purging the open voids and cleaning the surface of the open voids uses a rinse dry process.

15. The method of claim 11, wherein purging the open voids and cleaning the surface of the open voids includes a rinse dry process and oxide removal from the surface of the voids.

16. The method of claim 11, wherein the dry chemical deposition process comprises chemical vapor deposition.

17. The method of claim 11, wherein the dry chemical deposition process comprises atomic layer deposition.

18. The method of claim 11, wherein cleaning the surface of the voids includes a hydrogen plasma treatment.

19. The method of claim 11, wherein the plurality of holes are 25 to 40 micrometers deep.

20. The method of claim 11, wherein the plurality of holes are 5 to 10 micrometers in diameter.

21. The method of claim 11, wherein the plurality of holes are 25 to 40 micrometers deep and 5 to 10 micrometers in diameter.

22. A method comprising:
 providing a semiconductor wafer having a plurality of holes;
 depositing a conformal metal layer to partially fill the holes to leave open voids so as to form an outer core;
 purging the open voids and cleaning the surface of the open voids; and
 using a dry deposition process to fill the open voids with a semiconductor so as to form an inner core.

23. The method according to claim 22, wherein the plurality of holes are 5 to 10 micrometers in diameter.

24. The method of claim 22, wherein depositing a conformal metal layer to partially fill the holes uses a wet chemical process.

25. The method of claim 22, wherein depositing a conformal metal layer to partially fill the holes uses electrochemical plating.

26. The method of claim 22, wherein depositing a conformal metal layer to partially fill the holes uses electroless deposition.

27. The method of claim 22, wherein depositing a conformal metal layer to partially fill the holes uses chemical vapor deposition.

28. The method of claim 22, wherein the conformal metal layer comprises copper.

29. The method of claim 22, wherein purging the open voids and cleaning the surface of the open voids uses a rinse dry process.

30. The method of claim 22, wherein purging the open voids and cleaning the surface of the open voids includes a rinse dry process and oxide removal from the surface of the open voids.

31. The method of claim 22, wherein the dry deposition process comprises chemical vapor deposition.

32. The method of claim 22, wherein the dry deposition process comprises atomic layer deposition.

33. The method of claim 22, wherein the dry deposition process comprises chemical vapor deposition of silicon or silicon carbide.

34. The method of claim 22, wherein the dry deposition process comprises atomic layer deposition of silicon or silicon carbide.

* * * * *